US011016701B2

(12) United States Patent
Young et al.

(10) Patent No.: US 11,016,701 B2
(45) Date of Patent: May 25, 2021

(54) OSCILLATOR CIRCUITRY TO FACILITATE IN-MEMORY COMPUTATION

(71) Applicant: Intel Corporation, Santa Clara, CA (US)

(72) Inventors: Ian Young, Portland, OR (US); Ram Krishnamurthy, Portland, OR (US); Sasikanth Manipatruni, Portland, OR (US); Amrita Mathuriya, Portland, OR (US); Abhishek Sharma, Hillsboro, OR (US); Raghavan Kumar, Hillsboro, OR (US); Phil Knag, Hillsboro, OR (US); Huseyin Sumbul, Portland, OR (US); Gregory Chen, Portland, OR (US)

(73) Assignee: Intel Corporation, Santa Clara, CA (US)

(*) Notice: Subject to any disclaimer, the term of this patent is extended or adjusted under 35 U.S.C. 154(b) by 314 days.

(21) Appl. No.: 16/146,878

(22) Filed: Sep. 28, 2018

(65) Prior Publication Data
US 2019/0042159 A1   Feb. 7, 2019

(51) Int. Cl.
*G06F 3/06* (2006.01)
*G11C 7/10* (2006.01)
*H03K 3/03* (2006.01)

(52) U.S. Cl.
CPC .......... *G06F 3/0659* (2013.01); *G06F 3/0604* (2013.01); *G06F 3/0673* (2013.01); *G11C 7/1096* (2013.01); *H03K 3/0315* (2013.01)

(58) Field of Classification Search
CPC .............. G11C 7/1096; G11C 16/0483; G11C 16/3459; G11C 7/1045; G11C 8/18;
(Continued)

(56) References Cited

U.S. PATENT DOCUMENTS 6,252,471 B1    6/2001  Salter et al.
2006/0158945 A1*  7/2006  Sakimura ........... G11C 13/0061
                                              365/205

(Continued)

OTHER PUBLICATIONS

International Search Report and Written Opinion for PCT/US2019/039826, dated Oct. 24, 2019.
(Continued)

*Primary Examiner* — Arnold M Kinkead
(74) *Attorney, Agent, or Firm* — Green, Howard & Mughal LLP.

(57) ABSTRACT

Techniques and mechanisms for a memory device to perform in-memory computing based on a logic state which is detected with a voltage-controlled oscillator (VCO). In an embodiment, a VCO circuit of the memory device receives from a memory array a first signal indicating a logic state that is based on one or more currently stored data bits. The VCO provides a conversion from the logic state being indicated by a voltage characteristic of the first signal to the logic state being indicated by a corresponding frequency characteristic of a cyclical signal. Based on the frequency characteristic, the logic state is identified and communicated for use in an in-memory computation at the memory device. In another embodiment, a result of the in-memory computation is written back to the memory array.

18 Claims, 8 Drawing Sheets

(58) Field of Classification Search
CPC ..... G11C 7/22; G11C 13/003; G11C 2213/75;
G11C 11/409; H01L 27/1052; H01L
27/115; H01L 27/112; H01L 27/11206;
H01L 27/10; H01L 27/286; H01L
29/0665; H01L 29/0673; H01L 29/42324;
H01L 29/78; H01L 45/085; H01L
45/1233; H01L 45/1266; H01L 51/0048;
H01L 51/0052; H01L 51/0508; H01L
45/145; H01L 27/105; H01L 27/11519;
H01L 27/11521; H01L 27/11526; H01L
27/11546; H01L 27/11558; H01L
27/2463; H01L 27/2481; H01L
2924/0002; H01L 29/66825; H01L
29/7883; H01L 45/146; H01L 45/16;
H01L 27/101; H01L 27/24; H01L
27/2409; H01L 27/2418; H01L 27/2436;
H01L 2924/00; H01L 45/06; H01L 45/12;
H01L 45/122; H01L 45/148; H01L
45/1608; H01L 21/76888; H01L
21/76894; H01L 23/5256; H01L 27/249;
H01L 2924/12044; H01L 2924/3011;
H01L 45/04; H01L 45/08; H01L 45/1253;
H01L 45/142; H01L 45/143; G06F
3/0659; G06F 3/0675; G06F 3/0604;
H03K 3/0315

USPC ......... 365/148, 205; 331/2, 46, 57; 714/722, 714/26

See application file for complete search history.

(56) References Cited

U.S. PATENT DOCUMENTS

| 2012/0063195 | A1* | 3/2012 | Lam ................ G11C 11/5642 365/148 |
| 2014/0092664 | A1 | 4/2014 | Bourianoff et al. |
| 2014/0268998 | A1* | 9/2014 | Jo ................... G11C 11/5685 365/148 |
| 2015/0194928 | A1 | 7/2015 | Wang |
| 2017/0133080 | A1 | 5/2017 | Gans et al. |
| 2019/0042159 | A1 | 2/2019 | Young et al. |

OTHER PUBLICATIONS

International Preliminary Report on Patentability for PCT Application No. PCT/US2019/039826, dated Apr. 8, 2021.

* cited by examiner

OSCILLATOR CIRCUITRY TO FACILITATE IN-MEMORY COMPUTATION

BACKGROUND

1. Technical Field

Embodiments of the invention generally relate to operation of a memory device and more particularly, but not exclusively, to circuit structures for implementing an in-memory computation.

2. Background Art

In modern image, speech, and pattern recognition operations, comparing, matching, multiplying and other processing of sample data is often required. Machine learning algorithms are used in various applications such as embedded-sensor networks and computer vision. The operation of pattern recognition can be used for classification in machine learning. Pattern recognition is also used for multimedia applications such as object detection or speech recognition. Computation in pattern recognition is one type of repetitive process which has traditionally required regular memory accesses, and as such, has consumed significant energy.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments described herein variously provide techniques and mechanisms for detection of a logic state with a voltage-controlled oscillator (VCO) of a memory device, where said detection facilitates one or more data computation operations performed locally at the memory device. In an embodiment, a VCO circuit of a memory device—e.g., the VCO including a ring oscillator (RO)—is coupled to memory cells of a memory array via a data line such as a bit line or a word line. During operation of such a memory device, the data line provides a first signal which indicates a logic state that is based on at least one bit currently stored by said memory cells. The VCO may provide a conversion from the logic state being indicated by a voltage characteristic of the first signal to the logic state being indicated by a corresponding frequency characteristic of a second signal. Frequency detection and other signal processing may be performed, based on the second signal, to identify the logic state. Based on such identification, one or more computations may be performed locally at the memory—e.g., wherein a result of such one or more computations is automatically written back to the memory array.

As used herein in the context of "in-memory computing," "in-memory compute operation," "in-memory data computation" and related phrases, the term "in-memory" refers to the characteristic of an action being performed locally at a memory device which includes both a memory array and input and/or output (or "IO") interface logic by which the memory device is to couple to, and communicate with, some memory controller, processor or other external agent.

Current in-memory computation techniques variously rely on the evaluation of a signal voltage level for the identification of a given logic state. However, voltage-based resolving of logic states is somewhat imprecise, and expected to be increasingly difficult as power-efficient memory devices continue to trend toward lower operating voltages. By using a VCO and the frequency of a cyclical signal as a basis for identifying a logic state, embodiments variously provide greater accuracy in the identification of logic states.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

For purposes of the embodiments, the transistors in various circuits, modules, and logic blocks are Tunneling FETs (TFETs). Some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors-BJT PNP/NPN, BiCMOS, CMOS, etc., may be used for some transistors without departing from the scope of the disclosure.

It is pointed out that those elements of the figures having the same reference numbers (or names) as the elements of any other figure can operate or function in any manner similar to that described, but are not limited to such.

Figure 1:
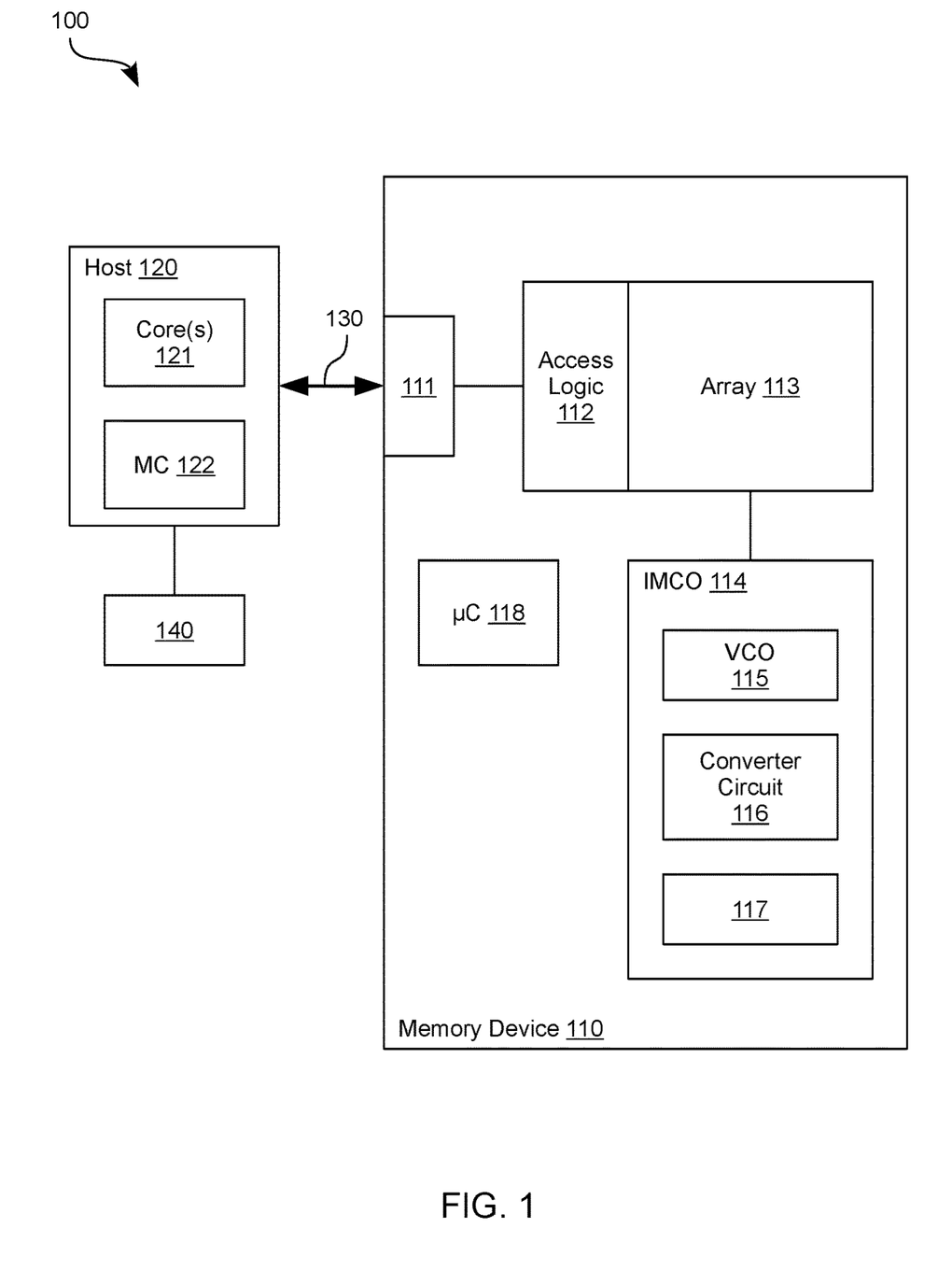
FIG. 1 is a functional block diagram illustrating elements of a system to provide in-memory computing according to an embodiment.

FIG. 1 shows features of a system 100 to provide data for in-memory compute operations according to an embodiment. System 100 is one example of an embodiment wherein a memory device includes a voltage-controlled oscillator (VCO) circuit operable to facilitate the detecting of one or more stored data values. Such detecting may facilitate an in-memory compute operation to be performed locally at the memory device.

As shown in FIG. 1, system 100 includes a memory device 110 and a host 120 coupled, via an interconnect 130, to an input/output (IO) interface 111 of memory device 110.

Host 120 illustrates any of a variety of one or more agents to control operation of memory device 110. In the example shown, host 120 comprises a memory controller MC 122 to provide access to memory device 110 for one or more cores 121 of a host processor that is included in (or in other embodiments, coupled to) host 120. Such a host processor may include circuitry configured to execute a general-purpose operating system and/or other software for a computer platform that includes system 100. In one embodiment, memory device 110 is an integrated circuit (IC) die other than any IC die of host 120. For example, memory device 110 may be a packaged device other than any packaged device of host 120. In another embodiment, system 100 is a system-on-chip (SoC) device. Although some embodiments are not limited in this regard, system 100 may further comprise or couple to one or more other resources (such as the illustrative repository 140 shown) which, for example, facilitate relatively long-term data storage. By way of illustration and not limitation, repository 140 may include a solid state drive (SSD), hard disk drive (HDD) or the like.

Interconnect 130 may comprise signal lines to variously exchange signaling between host 120 and memory device 110. For example, interconnect 130 may include a data bus, an address bus, a command bus and/or any of a variety of combinations of some or all such buses in support of host 120 accessing or otherwise controlling memory device 110. Interconnect 130 may further include one or more control signal lines for control signaling (e.g., other than command, address and/or data signaling) to memory device 110. A reader of skill in the art will appreciate that such control signal lines may communicate, for example, one or more of a chip select signal, a write enable signal, an output enable signal, a clock signal, a column address strobe signal, a row address strobe signal or any of a variety of other conventional control signals. As discussed herein, one or more control signals lines of interconnect 130 may indicate (explicitly or implicitly) that an in-memory compute operation is to be performed at device 110 based on data which is stored at a local array of memory cells.

Memory device 110 may include any of a variety of types of memory technology wherein memory cells are arranged in rows and columns—e.g., where data stored by said cells is accessible via word lines and bit lines, or an equivalent thereof. In one embodiment, memory device 110 includes static random-access memory (or "SRAM"). However, any of various other types of memory cell technologies may be adapted for operation with a VCO circuit, as described herein. In the example embodiment shown, memory device 110 includes an array 113 of memory cells (or "memory array"), which represents one or more logical and/or physical groups of memory. An example of one such grouping of memory is a bank of memory resources that, for example, may include storage elements arranged in rows and columns.

Memory device 110 may include access logic 112 to facilitate, at least in part, access to array 113—e.g. where such access is provided for servicing one or more commands from host 120. Access logic 112 may include, or operate in conjunction with, logic of memory device 110 which provides memory resource access according to conventional techniques. By way of illustration and not limitation, access logic 112 may include or couple to command logic and address logic which is used to decode an access instruction to the proper memory location within array 113. Command logic and address logic may be implemented, for example, with a state machine or other such circuitry.

During operation of system 100, host 120 may send commands or instructions to memory device 110 over a bus of interconnect 130. Such commands may be interpreted by memory device 110—e.g. including memory device 110 decoding command information to perform a variety of access functions within the memory and/or decoding address information with column logic and/or row logic. For example, such logic may access a specific location in array 113 with a combination of a column address strobe or signal (CAS) and a row address strobe or signal (RAS). Rows of memory may be implemented in accordance with known memory architectures or their derivatives. Briefly, a row of array 113 may include one or more addressable columns of memory cells, as identified by the CAS generated by column logic of memory 110. The rows may each be variously addressable via the RAS generated by row logic of memory 110. A protocol used for such communication between host 120 and memory device 110 may be supported with a state machine or other such circuitry of device 110 (such as the illustrative microcontroller μC 118 shown)—e.g., where at least some of said communications are sent according to one or more conventional techniques. By way of illustration and not limitation, μC 118 may supplement otherwise conventional command/address signaling functionality which, for example, conforms to some or all requirements of a dual data rate (DDR) specification such as the DDR3 SDRAM JEDEC Standard JESD79-3C, April 2008 or the like.

In an embodiment, memory device 110 further comprises circuitry IMCO 114 to perform one or more in-memory compute operations based on data bits which are stored at array 113. As described herein, IMCO 114 may comprise any of a various types of Boolean circuit logic (such as the illustrative Boolean circuitry 117 shown) to receive input signaling based on data stored in array 113. Boolean circuitry 117 may comprise one or more NOT gates and/or combinatorial logic (e.g., including an AND gate, OR gate, NAND gate, NOR gate, XOR gate and/or the like), in various embodiments. In-memory computing with IMCO 114 may be based on signaling at one or more data lines (e.g., one or more bit lines or one or more word lines) of array 113—e.g., wherein such signaling includes a first signal indicating a first logic state which is based on a first one or more stored data bits and, in some embodiments, a second signal indicating a second logic state which is based on the first one or more stored data bits or another one or more stored data bits. Based on such signaling, Boolean circuitry 117 may generate an output signal which represents or otherwise indicates an at least partial result of a computation using said logic state(s). The one or more Boolean operations may implement an addition of data bits, a multiplication of data bits, and/or any of a variety of other such bit operations, which are not limiting on some embodiments. Based on the output signal, array 113 may be operated—e.g., in combination with access logic 112—to store one or more data bits which represent a result of an in-memory computation by IMCO 114.

To facilitate such an in-memory computation, IMCO 114 may further comprise (or couple to) one or more VCO circuits—e.g., including the illustrative VCO 115 shown—which are each operable to receive a respective signal from memory array 113 via a corresponding data line. A voltage characteristic of one such signal may indicate the respective logic state which is based on one or more data bits currently stored at memory array 113. VCO 115 provides a conversion of said voltage characteristic into a corresponding signal frequency characteristic—e.g., wherein the signal frequency characteristic, in turn, may be used subsequently as a basis for evaluating the logic state.

For example, VCO 115 may include any of a variety of ring oscillator architectures wherein, for example, an odd number of inverters (e.g., NOT gates) are configured in an in-series arrangement, and wherein a signal feedback path is provided across the in-series arrangement. In some embodiments, VCO 115 is to operate as a current starved ring oscillator. A signal generated by VCO 115 may be provided to a converter circuit 116 which, in an embodiment, includes circuitry to indicate a detected phase and/or frequency of said generated signal. Converter circuit 116 may further include or couple to circuitry to indicate a particular value—such as a single bit or multi-bit Boolean logic value—based on the detected signal phase and/or frequency. For example, such circuitry may perform a lookup or other translation operation based on some pre-defined reference information (or other pre-configured state) which specifies a correspondence of various values—e.g., single bit values or multi-bit values—each to a different respective frequency or range of frequencies. The indicated value may then be represented via signaling to Boolean circuitry 117 for use in one or more in-memory compute operations, as described herein.

Figure 2:
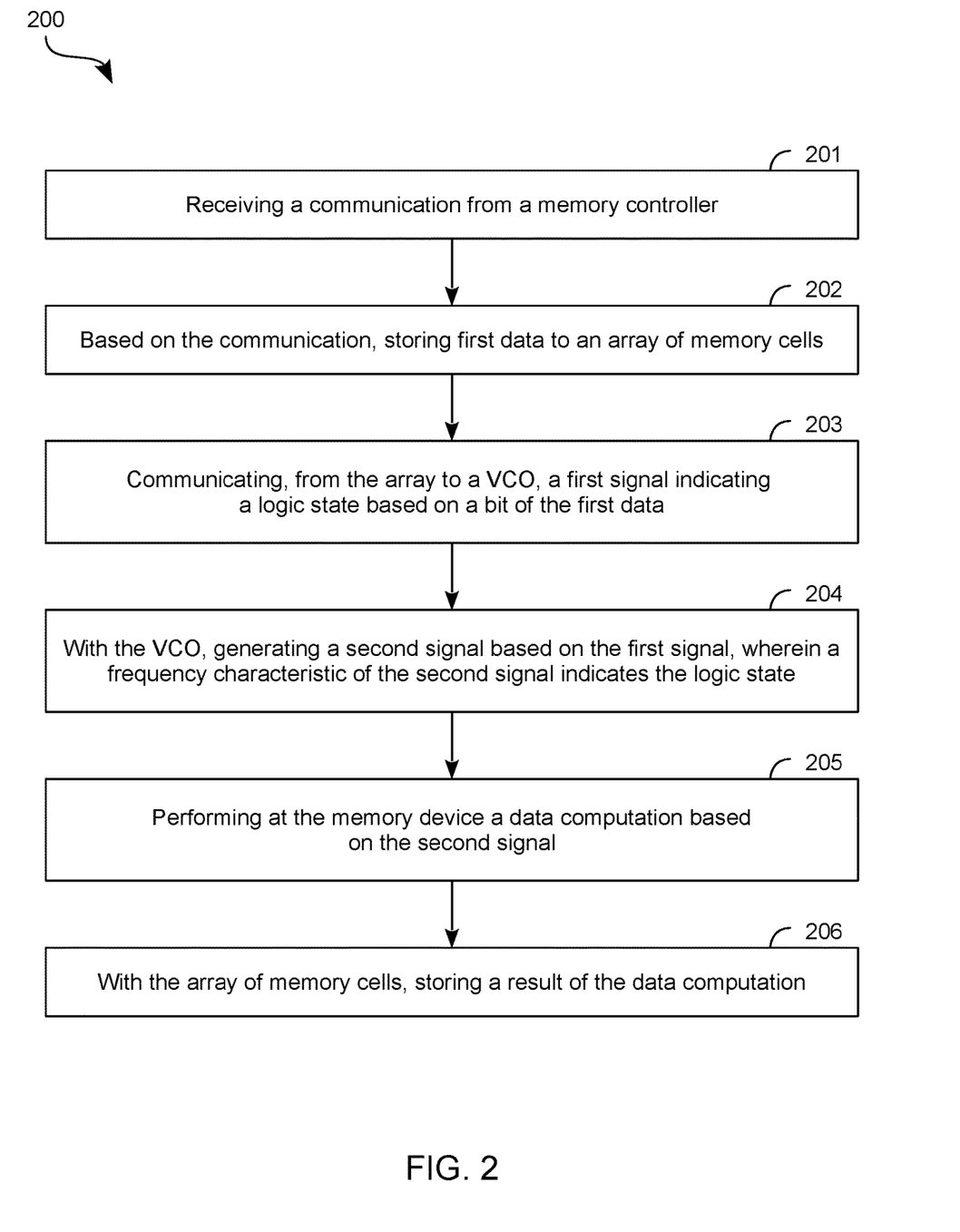
FIG. 2 is a flow diagram illustrating elements of a method to perform a data computation at a memory device according to an embodiment.

FIG. 2 shows features of a method 200 to perform an in-memory computation according to an embodiment. Method 200 is one example of an embodiment wherein a VCO is used to detect the value of a bit based on a signal which is provided via a data line (e.g., one of a bit line or a word line) of a memory device. Such detection may facilitate a data computation being performed locally at said memory device. Method 200 may be performed with circuitry of memory device 110, for example.

As shown in FIG. 2, method 200 includes (at 201) receiving a communication from a memory controller coupled to the memory device. The receiving at 201 may include, for example, I/O interface 111 receiving via interconnect 130 a data write instruction from memory controller MC 122—e.g., on behalf of the one or more cores 121. Based on the communication received at 201, method 200 may (at 202) store first data to an array of memory cells of the memory device. In various embodiments, at least some data is stored in the array in an arrangement wherein the bits of a given value are stored in different respective words, the bits each accessible via the same bit line of the array (e.g., wherein the bits of the value are arranged along the bit line each according to their respective bit significance). Such an arrangement may facilitate an in-memory computation which operates on bits of different values, where said bits have the same bit significance.

Method 200 may further comprise (at 203) communicating a first signal from the array to a voltage-controlled oscillator (VCO) circuit of the memory device, the first signal indicating a logic state which is based on a bit of the first data. For example, at some time after the storing at 202 (and while the data is still stored by the array), the memory device may be configured to perform an in-memory data computation—e.g., as directed by an agent of an external host or, responsive to some predefined trigger condition, by a state machine or other control circuitry (e.g., µC 118) of the memory device. The in-memory data computation may include or otherwise be based on the communicating at 203.

In an embodiment, the first signal is communicated at 203 via a data line (e.g., a bit line or, alternatively, a word line) which couples one or more memory cells of the array to the VCO circuit. Such communication may be based on the configuration of a mode at the memory device which supports in-memory computing—e.g., wherein an alternative mode of the memory device disables in-memory computing to instead facilitate at least some data read and/or data write functionality. By way of illustration and not limitation, other operations (not shown) of method 200 may include selectively enabling a conductive path with switch circuitry which is coupled between the VCO and the data line, wherein the first signal is communicated at 203 via said conductive path. The selective enabling of such a conductive path may be performed in response to an explicit mode configuration instruction (or other communication) received by the memory device from the memory controller. Alternatively, control logic at the memory device may automatically detect for an instance of a local event or other state (e.g., an expiration of a predefined time period, the completion of a data write and/or the like) which is predefined as being a condition to trigger the configuration of an in-memory computation mode.

Method 200 may further comprise (at 204) generating a second signal with the VCO circuit based on the first signal, wherein a frequency characteristic of the second signal indicates the logic state. For example, the VCO circuit may comprise a current starved ring oscillator or other such ring oscillator. A voltage level of the first signal—e.g., the voltage level indicating whether the logic state is Boolean "1" or a Boolean "0"—may determine at least in part a cyclical frequency the second signal. Accordingly, such a cyclical frequency may subsequently be used to determine the logic state. For example, method 200 may further comprise signal conversion operations (not shown)—e.g., including phase or frequency detection, digital encoding and/or the like—which generates, based on the second signal, a third signal identifying a data value corresponding to the frequency characteristic. Said third signal, representing the logic state, may be provided to combinatorial and/or other Boolean logic for use in one or more in-memory computing operations.

For example, method 200 may further comprise (at 205) performing at the memory device a data computation based on the second signal. Such data computation may be further based on one or more other signals which each represent a respective logic state based on a corresponding one or more stored bits—e.g., where such one or more other signals are generated each by a respective VCO using operations similar to operations 203, 204. For example, the VCO circuit may be one of multiple VCO circuits of the memory device—e.g., wherein the multiple VCO circuits are each coupled to the array via a different respective bit line. In an embodiment, method 200 further comprises (at 206) storing a result of the data computation with the array. For example, the result may be written back to the memory array using a same data line which was also used to communicate the first signal to the VCO circuit at 203.

Figure 3:
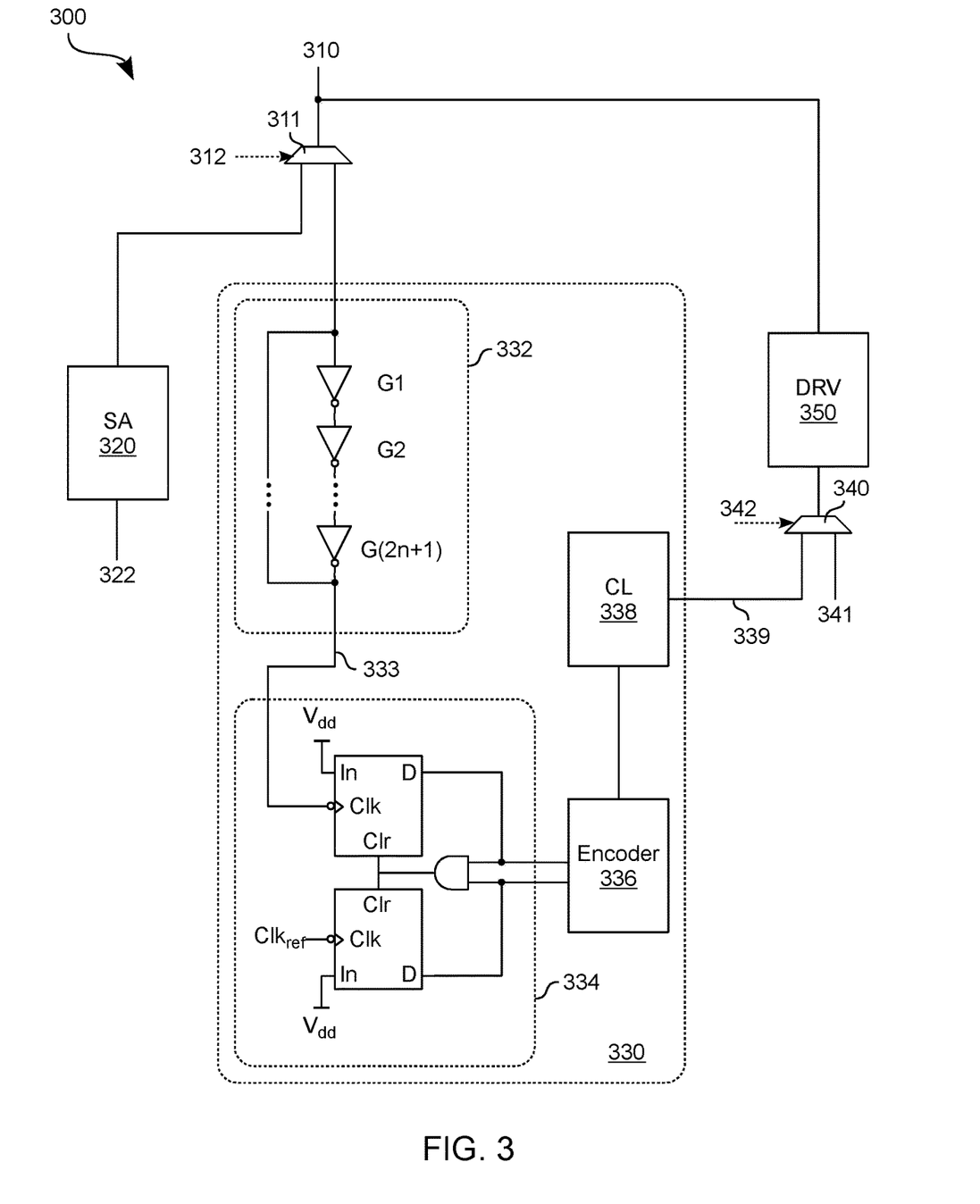
FIG. 3 is a hybrid circuit and functional block diagram illustrating elements of a memory device to provide in-memory computing according to an embodiment.

FIG. 3 shows features of a memory device 300 to perform an in-memory computation according to an embodiment. Memory device 300 is one example of an embodiment wherein a VCO circuit is coupled to receive from a memory array a first signal which indicates a logic state which is based on one or more bits of stored data. To facilitate the in-memory computation, the VCO may provide a conversion from the logic state being represented with a voltage characteristic of the first signal to the logic state being represented with a corresponding frequency characteristic of a second signal. Memory device 300 may include some or all of the features of memory device 110 and/or may be used to perform some or all of method 200, for example.

As shown in FIG. 3, memory device 300 comprises circuitry 330 which, for example, provides some or all of the functionality of IMCO 114. Circuitry 330 may be coupled to receive signaling from a memory array and/or to provide signaling to facilitate the writing of data to said memory array. For example, a data line 310 of memory device 300—e.g., a bit line—may be coupled between circuitry 330 and a column of memory cells (not shown) in the memory array.

Communication between data line 310 and circuitry 330 may be selectively enabled and/or disabled with switch logic (e.g., including the illustrative demultiplexer DMUX 311 and multiplexer MUX 340 shown) which is coupled therebetween. Responsive to control signals 312, 342 (from μC 118, for example) DMUX 311 and MUX 340 may be variously switched between respective configurations to enable any one of an in-memory compute mode or one or other modes which support data reads from the memory array and/or data writes to the memory array. For example, a data read may include sense amplifier circuitry SA 320 of memory device 300 outputting a data signal 322 which is based on signaling from data line 310—e.g., wherein a data write includes driver circuitry DRV 350 outputting to data line 310 a signal which is based on another data signal 341 received by memory device 300.

Circuitry 330 may include or couple to one or more VCO circuits (e.g., including the illustrative ring oscillator RO 332 shown) which are variously coupled to the memory array, the one or more VCO circuits to facilitate detection of one or more stored data bits. In the example shown, when configured to support in-memory computation, DMUX 311 may provide a conductive path for RO 332 to receive the first signal from data line 310.

Based on the first signal, RO 332 generates another signal 333 which subsequently may be processed to determine a logic state which corresponds to a frequency characteristic of signal 333. By way of illustration and not limitation, signal 333 may be provided to a phase frequency detector 334 which detects a comparative relationship between the respective frequencies of signal 333 and some reference cyclical signal $Clk_{ref}$.

In one such embodiment, one or more output signals from phase frequency detector 334 may indicate to an encoder 336 a corresponding data value (single bit or multi-bit) which is to be used for performing an in-memory computation. For example, phase frequency detector 334 may indicate whether a data value to be indicated by encoder 336 should be incremented up or down. Any of a variety of conventional encoding schemes and/or mechanisms may be adapted to identify a data value as corresponding to a frequency of the second signal, and some embodiments are not limited to a particular encoding scheme and/or mechanism.

Based on the second signal, encoder 336 provides signaling to indicate a detected logic state to one or more Boolean circuits (e.g., including the illustrative combinatorial logic CL 338 shown). CL 338 may operate based on the logic state (and in some embodiments, one or more other logic states similarly determined each with a respective VCO) to generate an output 339 that is to be stored back to the memory array—e.g., using MUX 340 and DRV 350. In the example shown, a data value indicated by output 339 is written to the memory array using the same data line 310 by which the first signal was communicated to RO 332. Alternatively, such a data value may instead be written to the memory array using a different data line (not shown).

Figure 4:
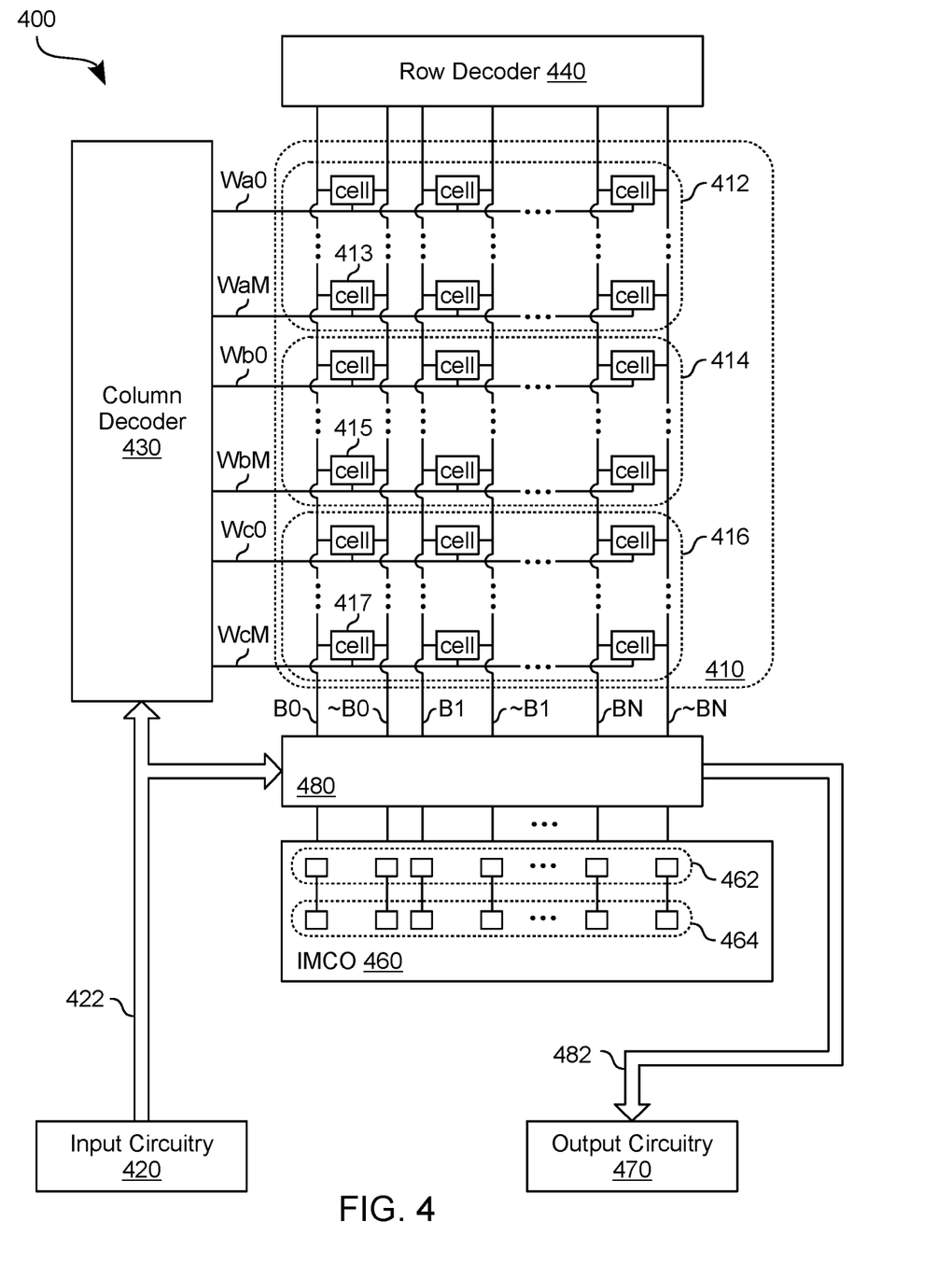
FIG. 4 is a functional block diagram illustrating elements of a device to provide in-memory computing according to an embodiment.

FIG. 4 shows features of a device 400 to provide data for in-memory compute operations according to another embodiment. Device 400 may include features of one of memory devices 110, 300, for example, and/or may be used to perform some or all of method 200. As shown in FIG. 4, device 400 comprises input circuitry 420 and output circuitry 470 to variously couple, and communicate with, a memory controller or other host logic (not shown). Input circuitry 420 and output circuitry 470 may provide some or all of the functionality of IO interface 111, for example. Device 400 further comprises an array 410 of memory cells which are arranged in rows and columns—e.g., wherein a given row of cells is accessible using a corresponding word line and wherein a given column of cells is accessible using at least one corresponding bit line.

Access logic of device 400 (e.g., providing functionality of access logic 112) may include a column decoder 430 and a row decoder 440 to variously decode address information of a memory access command received in communications 422 via input circuitry 420. Based on such decoding, column decoder 430 and row decoder 440 may variously operate word lines and bit lines to access one or more memory cells of array 410.

In the example shown, a given column of memory cells in array 410 may be accessed using a corresponding pair of bit lines (or "line pair")—e.g., where said cells each have a six transistor (6T) memory cell architecture. For example, bit lines of array 410 include a pair of bit lines [B0,~B0], where the logic state of a single stored bit may be communicated with bit line B0 while the opposite of that logic state is communicated with bit line ~B0. Similarly, an adjoining column of memory cells may be accessed with a line pair [B1, ~B1]—e.g., where another column of memory cells is accessed with a line pair [BN, ~BN].

The coupling of multiple cells in the same column to the same bit line—e.g., to bit line B0—may enable said bit line to communicate a signal which represents a logical AND'ing of the respective bits stored by said multiple cells. Similarly, the complementary bit line—e.g., bit line ~B0—may concurrently communicate another signal which represents a logical AND'ing of the opposite states of said bits. For example, array 410 is shown as including a sub-array 412 accessible with word lines Wa0, . . . , WaM, another sub-array 414 accessible with word lines Wb0, . . . , WbM, and another sub-array 416 accessible with word lines Wb0, . . . , WbM. This particular arrangement of sub-arrays 412, 414, 416 is merely illustrative of one use for device 400, and is not limiting on some embodiments.

In one such embodiment, word lines WaM, WbM (for example) may be concurrently operated to access cells 413, 415 which are in respective sub-arrays 412, 414 and also in the same column—e.g., while cell 413 stores a bit A and cell 415 stores a bit B. As a result of such operating, a voltage level at bit line B0 may indicate a logic level which is equivalent to the AND'ed combination (A·B). By contrast, a concurrent voltage level at bit line ~B0 may indicate a logic level which is equivalent to the AND'ed combination (!A·!B).

Memory device 400 may include circuitry IMCO 460—e.g., providing functionality of IMCO 114—to perform one or more in-memory compute operations based on such signaling by bit lines B0, ~B0 (and/or signaling by one or more additional or alternative line pairs). For example, IMCO 460 may include multiple VCO circuits 462 each coupled to a respective bit line of array 410 via circuitry 480 that is operable to selectively enable any one of an in-memory compute mode or one or other modes which support data reads from the memory array and/or data writes to the memory array. For example, circuitry 480 may selectively determine whether data signals are to be directed to IMCO 460 or to an output path 482 for communication from memory device 400 via output circuitry 470. Circuitry 480 may further provide sense amplifier and/or driver functionality—e.g., such as that of SA 320 and DRV 350—to facilitate data communication to output path 482 and/or a data write back to array 410 using an output from IMCO 460.

VCO circuits 462 may variously provide functionality, such as that of VCO 115 or RO 332, for conversion of a logic state being represented with a voltage characteristic of a given signal to the logic state being represented with a corresponding frequency characteristic of another signal. In an embodiment, VCO circuits 462 variously output signals each to a respective one of converter circuits 464 which, for example, provide functionality of converter circuit 116 (e.g., including functionality of phase frequency detector 334 and/or encoder 336). A digital logic signal generated with one of converter circuits 464 may be provided to combinatorial logic (not shown) of IMCO 460—e.g., for use in performing one or more in-memory computations. A result of such one or more in-memory computations may be written back to a cell of array 410—e.g., via circuitry 480. In one example embodiment, one or more cells of subarray 416 (e.g., including cell 417) are to store a result of an in-memory computation which is based both on a first value stored at sub-array 412, and on a second value stored at sub-array 414. However, any of a variety of other in-memory computations and data writes may be performed, in different embodiments.

Figure 5:
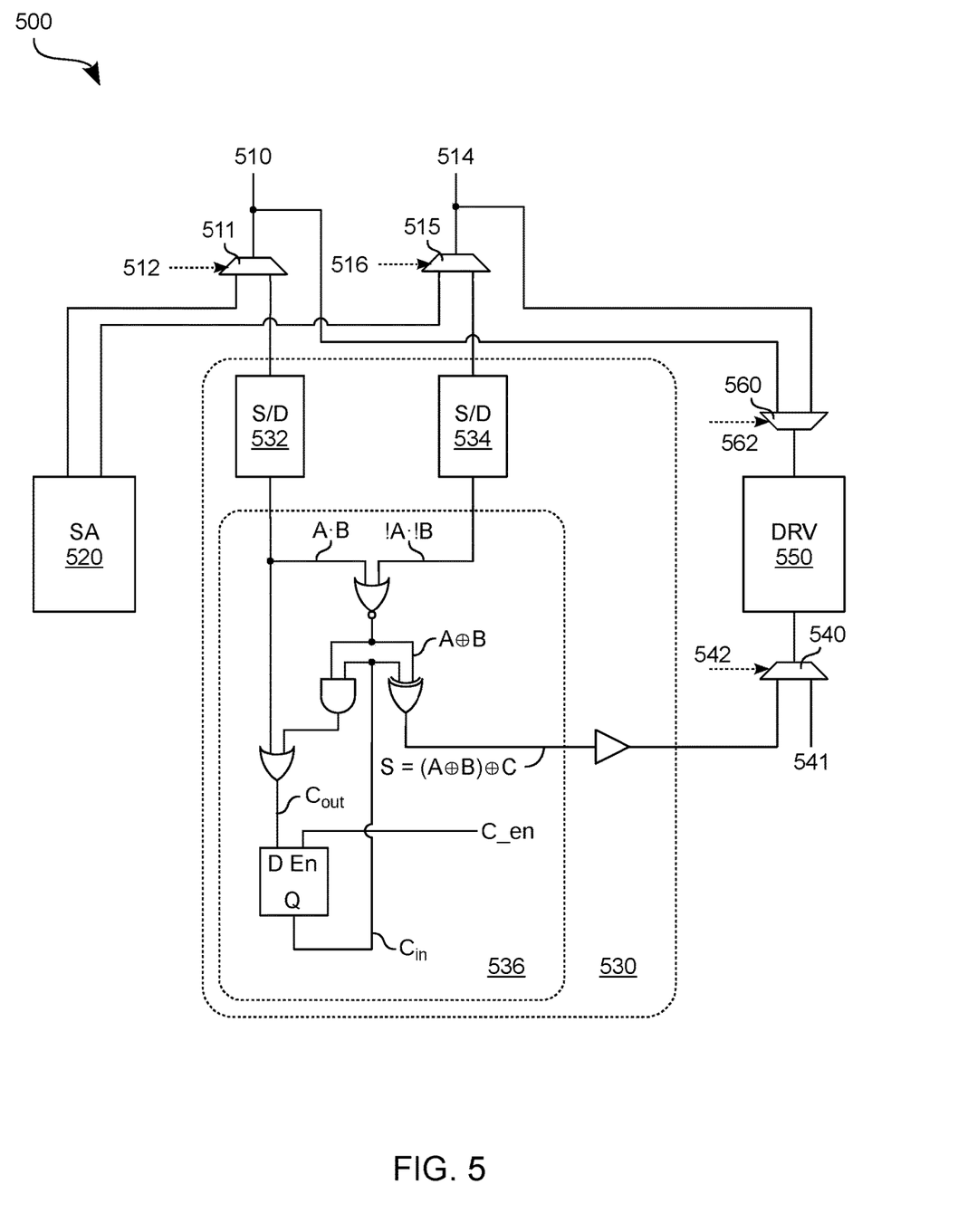
FIG. 5 is a hybrid circuit and functional block diagram illustrating elements of a memory device to provide in-memory computing according to an embodiment.

FIG. 5 shows features of a memory device 500 to perform an in-memory computation according to another embodiment. Memory device 500 may include some or all of the features of one of memory devices 110, 300, 400 and/or may be used to perform some or all of method 200.

As shown in FIG. 5, memory device 500 comprises circuitry 530 which (for example) provides functionality of one of IMCO 114, circuitry 330, or IMCO 460. Switch logic of memory device 500 (e.g., including the illustrative demultiplexer DMUX 511, multiplexer MUX 540 and demultiplexer DMUX 560 shown) is coupled to selectively enable and/or disable various conductive paths between circuitry 530 and a bit line 510. Similarly, one or more conductive paths between circuitry 530 and another bit line 514 may be variously enabled and/or disabled, selectively, with switch logic such as MUX 540, DMUX 560, and another demultiplexer DMUX 515.

With such switch logic, control signals 512, 516, 542 facilitate any one of an in-memory compute mode or one or other modes which support reads from the memory array and/or writes to the memory array. For example, a data read may include sense amplifier circuitry SA 520 of memory device 500 outputting one or more data signals which are based on signaling from bit lines 510, 514—e.g., wherein a data write includes a driver circuitry DRV 550 outputting to one of bit lines 510, 514 a signal which is based on another data signal 541 received by memory device 500. Alternatively, driver circuitry DRV 550 (or other circuitry of memory device 500) may output a result of an in-memory computation—e.g., wherein another control signal 562, to operate DMUX 560, enables a particular path for communicating such a result to a selected one of bit lines 510, 514.

Circuitry 530 may include or couple to VCO circuits which are variously coupled to the memory array each via a different respective bit line. In the example embodiment shown, circuitry 530 comprises sensor/detector circuits S/D 532, S/D 534 to receive signals via bit lines 510, 514 (respectively). S/D 532 includes a VCO to detect and process a signal received from bit line 510—e.g., where S/D 534 similarly includes a VCO to detect and process a signal from bit line 514. For example, one of (e.g., each of) S/D 532 or S/D 534 may provide some or all of the functionality of RO 332, phase frequency detector 334, and encoder 336. With such functionality, S/D 532 may output a first signal representing a logic state based on a first one or more stored bits—e.g., wherein S/D 534 outputs a second signal representing a logic state based on the same first one or more stored bits (or alternatively, another one or more stored bits). An in-memory operation on such states may be implemented by combinatorial logic 536 which receives the first signal and the second signal from S/D 532 and S/D 534 (respectively).

In the embodiment shown, bit lines 510, 514 are a pair of complementary bit lines (such as line pair B0, ~B0, or line pair B1, ~B2, or line pair BN, ~BN). In one example scenario, a first memory cell storing a bit A may be coupled to each of a first word line and bit lines 510, 514. Similarly, a second memory cell storing a bit B may be coupled to each of a second word line and the bit lines 510, 514. Both the first cell and the second cell may be accessed concurrently using each of the first word line, the second word line, and bit lines 510, 514. Such accessing may result in bit line 510 communicating a first signal which indicates a first logic state based on bits A, B—e.g., where a voltage level of the first signal indicates the equivalent of a logical AND'ing of bits A, B (i.e., the function A·B). Such an AND'ing may be due at least in part to the first memory cell and the second memory cell each being tied to bit line 510. Moreover, such accessing may also result in bit line 514 communicating a second signal which indicates the equivalent of a logical AND'ing of the opposite bit values (i.e., the function !A·!B).

With such signals, combinatorial logic 536 may perform an in-memory computation which (for example) adds a first stored value, which includes bit A, and a second stored value, which includes bit B. More particularly, combinatorial logic 536 may output a value S representing a bit of the arithmetic sum (A+B). Calculation of value S may be further based on a carry bit C_en which, for example, is determined based on the calculation (not shown) of a next less significant bit of said arithmetic sum. Calculation of value S may also result in the determining of another carry bit C_out which, for example, is available for use in the calculation of some next more significant bit (if any) of said arithmetic sum.

Figure 6:
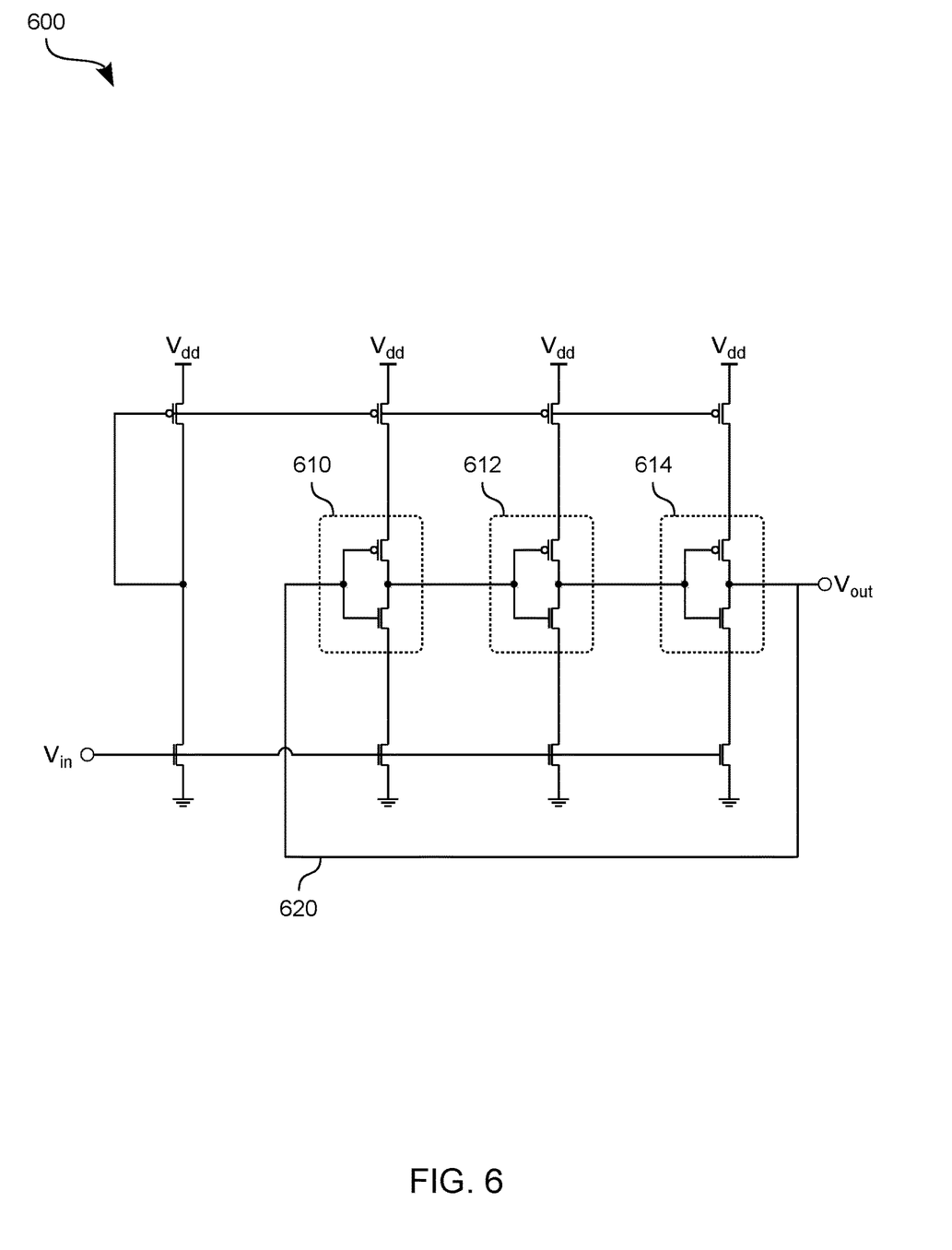
FIG. 6 is a circuit diagram illustrating elements of a ring oscillator circuit to facilitate in-memory computing according to an embodiment.

FIG. 6 shows features of a ring oscillator 600 of in-memory compute operation logic according to an embodiment. Ring oscillator 600 may be one of VCO 115, or ring oscillator 332, for example, or may otherwise be configured to facilitate operations method 200. Any of a variety of other ring architectures may be adapted, in alternative embodiments, for use to detecting a value of a data bit stored in a memory.

As shown in FIG. 6, ring oscillator 600 includes an in-series arrangement of an odd number of inverter circuits (e.g., including the illustrative CMOS inverters 610, 612, 614 shown) and a feedback path 620 across the in-series arrangement. The feedback path 620 couples an output $V_{out}$ at inverter 614 to an input of inverter circuit 610, a configuration which (due in part to the odd number of inverters) will result in contributes to an oscillation of the output $V_{out}$. A frequency of such oscillation may be determined at least in part by current starving of ring oscillator 600. Such current starving may be regulated with additional transistors and a voltage $V_{in}$ that is provided, for example, from a bit line of a memory array (not shown). As a result, a voltage characteristic of $V_{in}$ may result in, and thus be indicated by, a corresponding signal oscillation characteristic of $V_{out}$.

Figure 7:
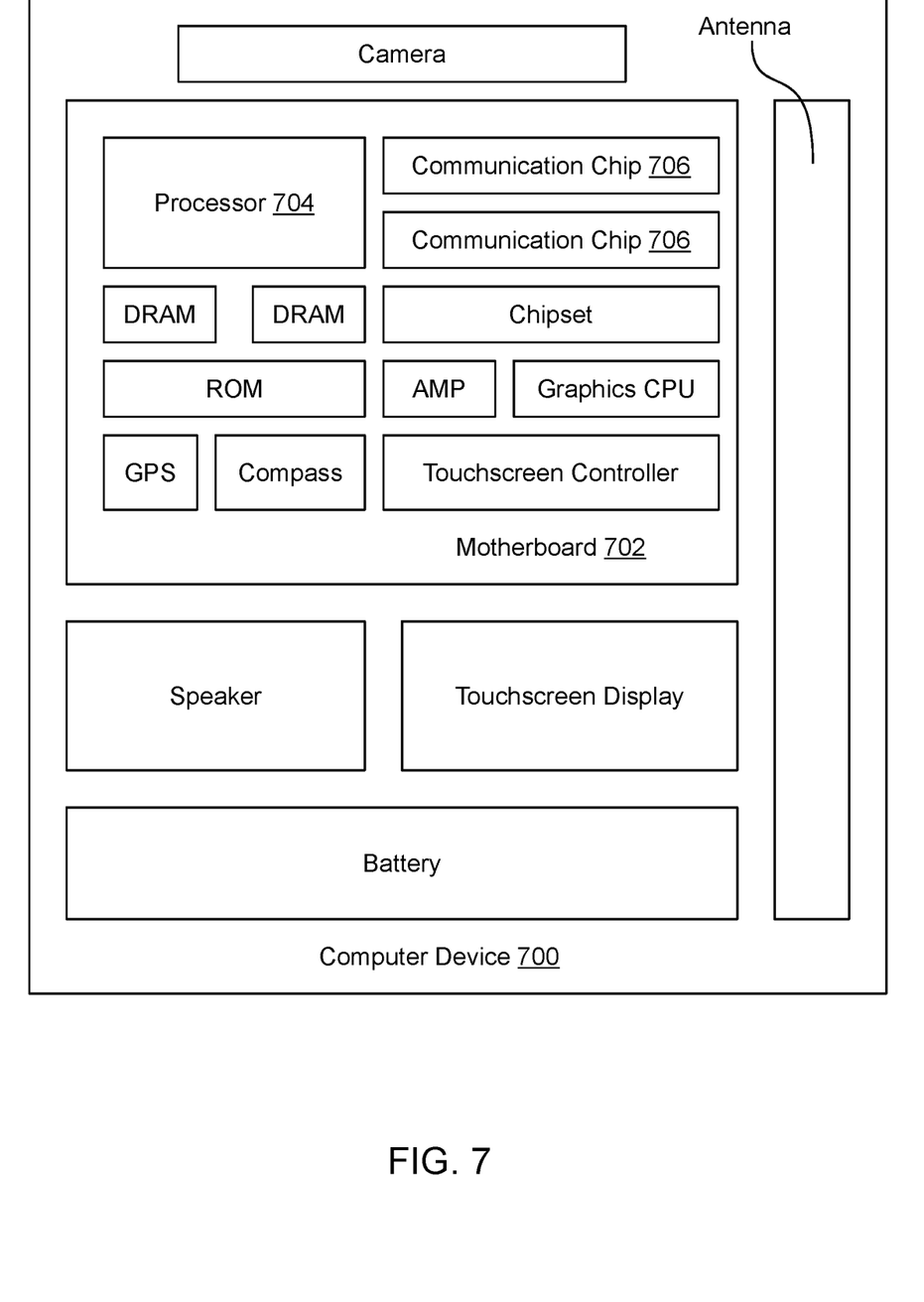
FIG. 7 is a functional block diagram illustrating a computing device in accordance with one embodiment.

FIG. 7 illustrates a computing device 700 in accordance with one embodiment. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. The term "processor" may refer to any device or portion of a device that processes electronic data from registers and/or memory to transform that electronic data into other electronic data that may be stored in registers and/or memory. The communication chip 706 also includes an integrated circuit die packaged within the communication chip 706.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 8:
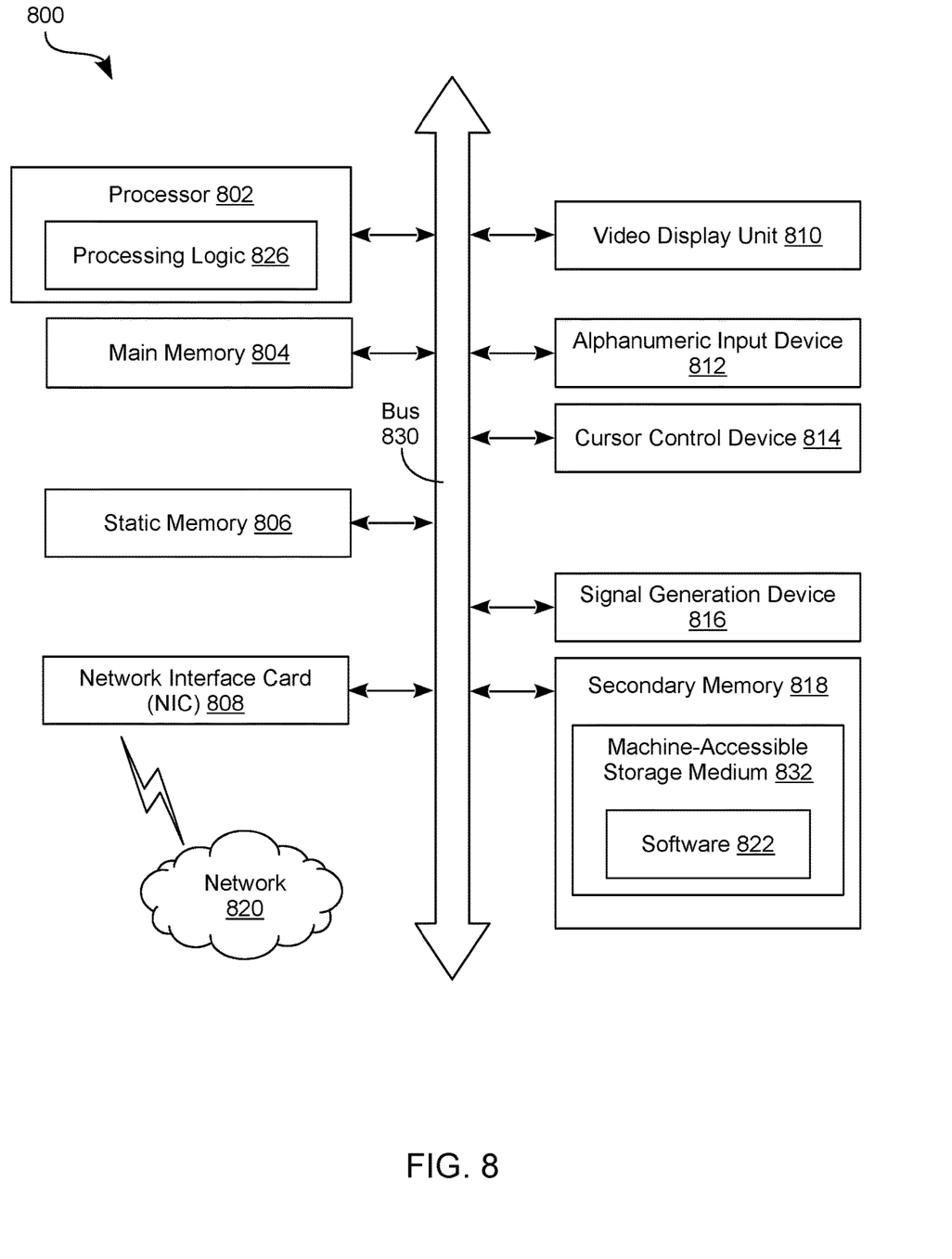
FIG. 8 is a functional block diagram illustrating an exemplary computer system, in accordance with one embodiment.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 832 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Techniques and architectures for performing an in-memory computation are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A memory device for performing an in-memory computation, the memory device comprising:
   first circuitry configured to couple the memory device to a memory controller, and to receive a communication from the memory controller;
   an array of memory cells;
   second circuitry coupled to the first circuitry and to the array, the second circuitry configured to store first data to the array based on the communication;
   multiple voltage-controlled oscillator (VCO) circuits each coupled to the array via a different respective bit line, the multiple VCO circuits comprising a first VCO circuit coupled to the array via a first bit line, the first VCO circuit to receive via the first bit line a first signal indicating a logic state based on a bit of the first data, and to generate a second signal based on the first signal, wherein a frequency characteristic of the second signal indicates the logic state; and
   third circuitry coupled to the first VCO circuit and to the array, the third circuitry to perform a data computation based on the second signal, wherein the array is coupled to receive and store a result of the data computation.

2. The memory device of claim 1, wherein the first VCO circuit comprises a ring oscillator.

3. The memory device of claim 2, wherein the ring oscillator comprises a current starved ring oscillator.

4. The memory device of claim 1, wherein the array is coupled to receive the result via the first bit line.

5. The memory device of claim 1, further comprising:
fourth circuitry coupled between the first VCO and the first bit line; and
fifth circuitry to selectively enable a conductive path of the fourth circuitry, the conductive path to communicate the first signal.

6. The memory device of claim 5, wherein the fifth circuitry is to selectively enable the conductive path responsive to another communication received from the memory controller via the first circuitry.

7. The memory device of claim 1, further comprising:
fourth circuitry to receive the second signal and to detect the frequency characteristic; and
fifth circuitry, coupled to the fourth circuitry, to generate a signal identifying a data value corresponding to the frequency characteristic.

8. A method at a memory device for performing a computation, the method comprising:
receiving a communication from a memory controller coupled to the memory device;
based on the communication, storing first data to an array of memory cells of the memory device;
communicating a first signal from the array to a first voltage-controlled oscillator (VCO) circuit of multiple VCO circuits of the memory device, the multiple VCO circuits each coupled to the array via a different respective bit line, the first signal indicating a logic state based on a bit of the first data;
with the first VCO circuit, generating a second signal based on the first signal, wherein a frequency characteristic of the second signal indicates the logic state;
performing at the memory device a data computation based on the second signal; and
with the array, storing a result of the data computation.

9. The method of claim 8, wherein the first VCO circuit comprises a ring oscillator.

10. The method of claim 8, further comprising providing the result to the array via the first bit line.

11. The method of claim 8, further comprising based on the second signal, generating another signal identifying a data value corresponding to the frequency characteristic.

12. A system for performing an in-memory computation, the system comprising:
a memory device comprising:
first circuitry configured to couple the memory device to a memory controller, and to receive a communication from the memory controller;
an array of memory cells;
second circuitry coupled to the first circuitry and to the array, the second circuitry configured to store first data to the array based on the communication;
multiple voltage-controlled oscillator (VCO) circuits each coupled to the array via a different respective bit line, the multiple VCO circuits comprising a first VCO circuit coupled to the array via a first bit line, the first VCO circuit to receive via the first bit line a first signal indicating a logic state based on a bit of the first data, and to generate a second signal based on the first signal, wherein a frequency characteristic of the second signal indicates the logic state; and
third circuitry coupled to the first VCO circuit and to the array, the third circuitry to perform a data computation based on the second signal, wherein the array is coupled to receive and store a result of the data computation; and
a display device coupled to the memory device, the display device to generate a display based on a signal communicated with the memory device.

13. The system of claim 12, wherein the first VCO circuit comprises a ring oscillator.

14. The system of claim 12, wherein the array is coupled to receive the result via the first bit line.

15. The system of claim 12, the memory device further comprising:
fourth circuitry coupled between the first VCO and the first bit line; and
fifth circuitry to selectively enable a conductive path of the fourth circuitry, the conductive path to communicate the first signal.

16. A memory device for performing an in-memory computation, the memory device comprising:
first circuitry configured to couple the memory device to a memory controller, and to receive a communication from the memory controller;
an array of memory cells;
second circuitry coupled to the first circuitry and to the array, the second circuitry configured to store first data to the array based on the communication;
a voltage-controlled oscillator (VCO) circuit coupled to the array via a data line, the VCO circuit to receive via the data line a first signal indicating a logic state based on a bit of the first data, and to generate a second signal based on the first signal, wherein a frequency characteristic of the second signal indicates the logic state, wherein the first signal is based on an access of two stored data bits, and wherein the logic state is an equivalent of an ANDing of the two stored data bits; and
third circuitry coupled to the VCO circuit and to the array, the third circuitry to perform a data computation based on the second signal, wherein the array is coupled to receive and store a result of the data computation.

17. A method at a memory device for performing a computation, the method comprising:
receiving a communication from a memory controller coupled to the memory device;
based on the communication, storing first data to an array of memory cells of the memory device;
communicating, from the array to a voltage-controlled oscillator (VCO) circuit of the memory device, a first signal indicating a logic state based on a bit of the first data, wherein the first signal is based on an access of two stored data bits, and wherein the logic state is an equivalent of an ANDing of the two stored data bits;
with the VCO circuit, generating a second signal based on the first signal, wherein a frequency characteristic of the second signal indicates the logic state;
performing at the memory device a data computation based on the second signal; and
with the array, storing a result of the data computation.

18. A system for performing an in-memory computation, the system comprising:
a memory device comprising:
first circuitry configured to couple the memory device to a memory controller, and to receive a communication from the memory controller;

an array of memory cells;

second circuitry coupled to the first circuitry and to the array, the second circuitry configured to store first data to the array based on the communication;

a voltage-controlled oscillator (VCO) circuit coupled to the array via a data line, the VCO circuit to receive via the data line a first signal indicating a logic state based on a bit of the first data, and to generate a second signal based on the first signal, wherein a frequency characteristic of the second signal indicates the logic state, wherein the first signal is based on an access of two stored data bits, and wherein the logic state is an equivalent of an ANDing of the two stored data bits; and third circuitry coupled to the VCO circuit and to the array, the third circuitry to perform a data computation based on the second signal, wherein the array is coupled to receive and store a result of the data computation; and a display device coupled to the memory device, the display device to generate a display based on a signal communicated with the memory device.

\* \* \* \* \*